(12) United States Patent
White (10) Patent No.: US 7,588,957 B2
(45) Date of Patent: Sep. 15, 2009

(54) CVD PROCESS GAS FLOW, PUMPING AND/OR BOOSTING

(75) Inventor: John M. White, Hayward, CA (US)

(73) Assignee: Applied Materials, Inc., Santa Clara, CA (US)

( * ) Notice: Subject to any disclaimer, the term of this patent is extended or adjusted under 35 U.S.C. 154(b) by 68 days.

(21) Appl. No.: 11/873,617

(22) Filed: Oct. 17, 2007

(65) Prior Publication Data

US 2009/0104732 A1 Apr. 23, 2009

(51) Int. Cl.
*H01L 21/00* (2006.01)
(52) U.S. Cl. .............................. 438/57; 438/58; 438/62; 438/96; 438/723; 438/785; 136/246; 136/249; 257/E21.09
(58) Field of Classification Search .................... 438/58, 438/62, 87
See application file for complete search history.

(56) References Cited

U.S. PATENT DOCUMENTS

| | | | | |
|---|---|---|---|---|
| 5,324,365 | A | * | 6/1994 | Niwa .......................... 136/256 |
| 5,401,330 | A | * | 3/1995 | Saito et al. ................... 136/259 |
| 5,527,396 | A | | 6/1996 | Saitoh et al. |
| 6,068,784 | A | | 5/2000 | Collins et al. |
| 6,624,865 | B2 | | 9/2003 | Edwards |
| 6,894,392 | B1 | | 5/2005 | Gudesen et al. |
| 2002/0109649 | A1 | | 8/2002 | Edwards |
| 2005/0011748 | A1 | | 1/2005 | Beck et al. |
| 2005/0223986 | A1 | | 10/2005 | Choi et al. |
| 2006/0088739 | A1 | | 4/2006 | Ovshinsky |
| 2006/0178557 | A1 | | 8/2006 | Mintchev et al. |
| 2007/0020903 | A1 | | 1/2007 | Takehara et al. |
| 2007/0121372 | A1 | | 5/2007 | Iwata et al. |
| 2007/0121402 | A1 | | 5/2007 | Ohshima |

OTHER PUBLICATIONS

PCT International Search Report and Written Opinion dated Dec. 5, 2008 for International Application No. PCT/US 08/79047.

* cited by examiner

*Primary Examiner*—Wael Fahmy
*Assistant Examiner*—Kyoung Lee
(74) *Attorney, Agent, or Firm*—Patterson & Sheridan LLP (57) ABSTRACT

The present invention generally comprises a method and apparatus for supplemental pumping, gas feed, and/or RF current for a process. When depositing amorphous silicon, the amount of process gases, RF current, and vacuum may be less than the amount of process gases, RF current, and vacuum necessary to deposit microcrystalline silicon. When a single chamber is used to deposit both amorphous and microcrystalline silicon, coupling a supplemental power supply, a supplemental gas source, and a supplemental vacuum pump to the chamber may be beneficial. The supplemental power supply, vacuum pump, and gas source, may be coupled with the chamber when the microcrystalline silicon is deposited and uncoupled when amorphous silicon is deposited. In a cluster tool arrangement, the supplemental power supply, vacuum pump, and gas source may serve multiple chambers that each deposit both amorphous and microcrystalline silicon.

14 Claims, 6 Drawing Sheets

CVD PROCESS GAS FLOW, PUMPING AND/OR BOOSTING

BACKGROUND OF THE INVENTION

1. Field of the Invention

Embodiments of the present invention generally relate to a system and method for supplementing the vacuum capabilities, gas introduction, and RF current to a processing chamber.

2. Description of the Related Art

When fabricating devices having multiple layers such as solar cells, it is sometimes beneficial to deposit multiple layers within a single processing chamber. Unless each of the layers is the exact same layer, it is likely that the process conditions for depositing each layer will be different. A first layer may require a high power level while the second layer may require a lower power level. Hence, to accommodate the high power level of the first layer, the power source needs to have at least the capacity necessary to deposit the first layer. When depositing the second layer, the power source does not supply as much power as its capacity permits. Additionally, the second layer may require a lower operating pressure compared to the first layer. The gas source needs to have the capability to supply the amount of gas necessary to deposit the second layer. When depositing the first layer, the gas supply does not supply as much gas as its capacity permits. Hence, while the process chamber has the capability to deposit both the first layer and the second layer, the process chamber also has excess power and gas supply capabilities for the second and first layers respectively.

When multiple chambers are coupled together to increase production, multiple chambers may have excess power and gas supply capabilities. Having power sources and gas supplies beyond the amount needed may be inefficient and expensive. Thus, across a production facility having multiple processing chambers, the excess power and gas capabilities could be quite expensive. Accordingly, there is a need in the art for harnessing the excess power and gas supply capabilities and increasing the efficiency of the production facility.

SUMMARY OF THE INVENTION

The present invention generally comprises a method and apparatus for supplemental pumping, gas feed, and/or RF current for a process. When depositing amorphous silicon, the amount of process gases, RF current, and vacuum may be less than the amount of process gases, RF current, and vacuum necessary to deposit microcrystalline silicon. When a single chamber is used to deposit both amorphous and microcrystalline silicon, coupling a supplemental power supply, a supplemental gas source, and a supplemental vacuum pump to the chamber may be beneficial. The supplemental power supply, vacuum pump, and gas source, may be coupled with the chamber when the microcrystalline silicon is deposited and uncoupled when amorphous silicon is deposited. In a cluster tool arrangement, the supplemental power supply, vacuum pump, and gas source may serve multiple chambers that each deposit both amorphous and microcrystalline silicon.

In one embodiment, a solar cell fabrication process comprises depositing a first silicon containing layer on a substrate in a processing chamber while a first vacuum pump, a first gas source, and a first RF power source are coupled with the processing chamber, coupling a second vacuum pump, a second gas source, and a second RF power source to the processing chamber, and depositing a second silicon containing layer over the first silicon containing layer in the processing chamber.

In another embodiment, a solar cell fabrication process comprises evacuating a processing chamber to a first pressure with a first vacuum pump, depositing an amorphous silicon layer over a substrate in the processing chamber while applying a first RF current from a first RF power source to a showerhead disposed in the processing chamber, and while introducing a first amount of processing gas into the processing chamber from a first gas source, coupling a second vacuum pump, a second RF power source, and a second gas source to the processing chamber, evacuating the processing chamber to a second pressure that is less than the first pressure using the first and second vacuum pumps, and depositing a microcrystalline silicon layer over the amorphous silicon layer while applying a second RF current greater than the first RF current, the second RF current flowing from the first and second RF power sources, and while introducing a second amount of processing gas greater than the first amount of processing gas, the second amount flowing from the first and second gas sources.

In another embodiment, a solar cell fabrication process comprises disposing a first substrate in a first processing chamber having a first RF power source, a first vacuum pump, and a first gas source coupled thereto, depositing an amorphous silicon layer over the first substrate, disposing a second substrate in a second processing chamber having a second RF power source, a second vacuum pump, and a second gas source coupled thereto, coupling a supplemental RF power source, a supplemental vacuum pump, and a supplemental gas source to the second processing chamber, depositing a microcrystalline silicon layer over the second substrate, uncoupling the supplemental RF power source, the supplemental vacuum pump, and the supplemental gas source from the second processing chamber, coupling the supplemental RF power source, the supplemental vacuum pump, and the supplemental gas source to the first processing chamber, and depositing a microcrystalline silicon layer over the amorphous silicon layer.

In another embodiment, a solar cell fabrication apparatus comprises at least one processing chamber, first and supplemental RF power sources coupled with the at least one processing chamber, first and supplemental vacuum pumps coupled with the at least one processing chamber, and first and supplemental gas sources coupled with the at least one processing chamber.

In another embodiment, a solar cell fabrication apparatus comprises a plurality of processing chambers each having a vacuum pump, a gas source, and an RF power source coupled thereto, and a supplemental vacuum pump coupled to the plurality of processing chambers, a supplemental RF power source coupled to the plurality of processing chambers, and a supplemental gas source coupled to the plurality of processing chambers.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present invention generally comprises a method and apparatus for supplemental pumping, gas feed, and/or RF current for a process. When depositing amorphous silicon, the amount of process gases, RF current, and vacuum may be less than the amount of process gases, RF current, and vacuum necessary to deposit microcrystalline silicon. When a single chamber is used to deposit both amorphous and microcrystalline silicon, coupling a supplemental power supply, a supplemental gas source, and a supplemental vacuum pump to the chamber may be beneficial. The supplemental power supply, vacuum pump, and gas source, may be coupled with the chamber when the microcrystalline silicon is deposited and uncoupled when amorphous silicon is deposited. In a cluster tool arrangement, the supplemental power supply, vacuum pump, and gas source may serve multiple chambers that each deposit both amorphous and microcrystalline silicon.

The invention, as described below, may be practiced in a PECVD system available from Applied Materials, Inc., Santa Clara, Calif. It is contemplated that the invention may be practiced in other plasma processing chambers, including those from other manufacturers.

Figure 1:
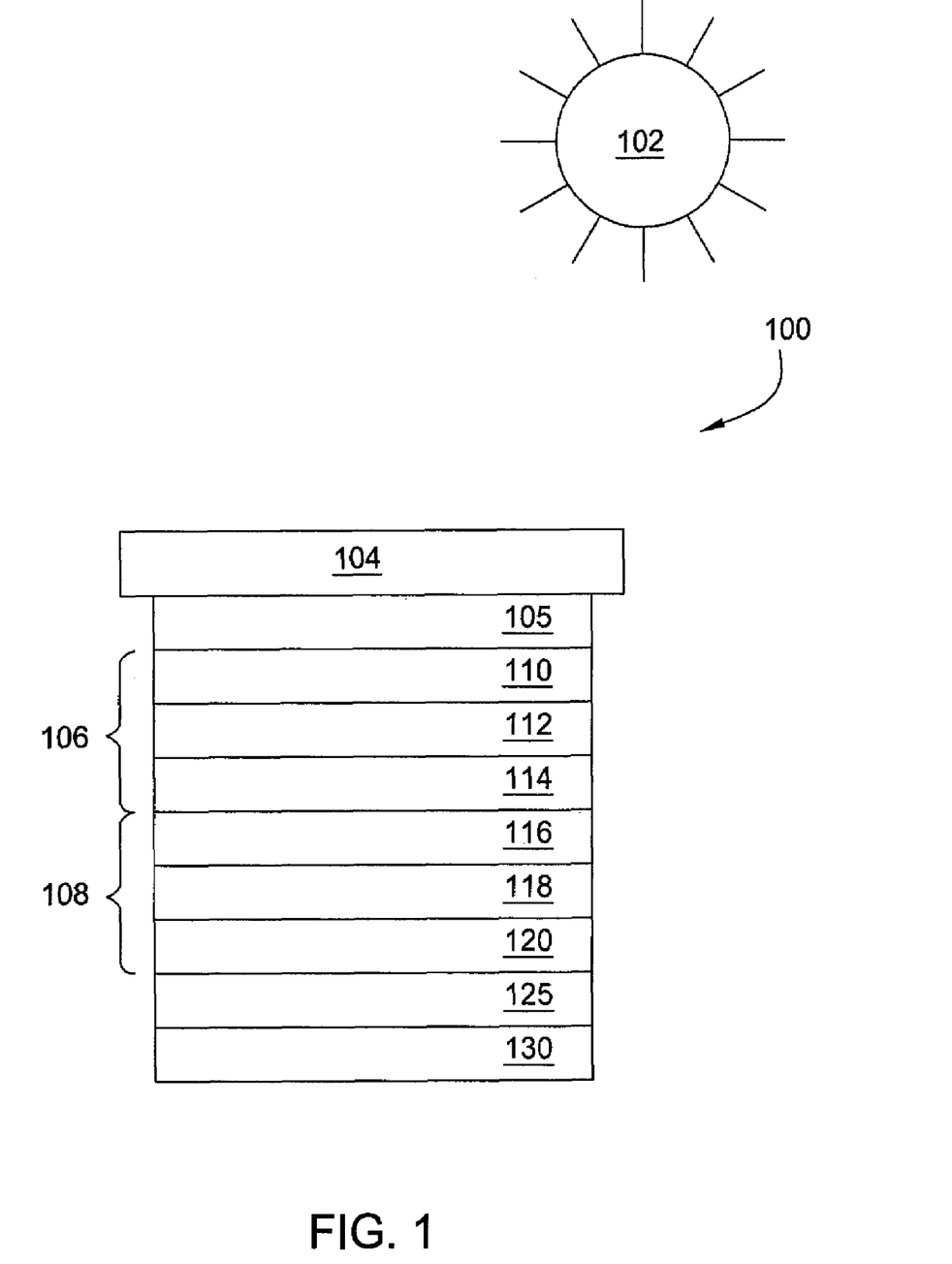
FIG. 1 is a schematic view of a dual tandem solar cell according to one embodiment of the invention.

FIG. 1 is a schematic view of a dual tandem solar cell 100 according to one embodiment of the invention. A dual tandem solar cell may be advantageous over a single junction amorphous silicon solar cell due to the wider spectrum of sunlight that may be used due to the intrinsic microcrystalline silicon layer 118. Additionally, as compared to a single junction intrinsic amorphous silicon solar cell, improved current for the solar cell may be present due to the serial connection of two junctions having two different band gap structures.

The solar cell 100 is shown with the substrate 104 facing the sun 102. The solar cell 100 comprises a top cell 106 and a bottom cell 108. The top cell 106 may be deposited onto the substrate 104 before the bottom cell 108. The top cell 106 may be deposited over a first transparent conductive oxide (TCO) layer 105 that may be disposed on the substrate 104. A transparent conductive oxide layer may be present between the top cell 106 and the substrate 104. A back side electrode may be deposited onto the solar cell 100 after the bottom cell 108. An optional interface layer may be present between the top cell 106 and the bottom cell 108. Over the bottom cell 108, a second TCO layer 125 and a metal backing layer 130 may be deposited. Once both the top cell 106 and the bottom cell 108 are deposited onto the substrate 104, the solar cell 100 may be flipped over so that the substrate 104 is closer to the sun 102 than the top cell 106 and the bottom cell 108. To improve light absorption by reducing light reflection, the substrate and/or one or more thin films formed thereover may be optionally textured by wet, plasma, ion, and/or mechanical processes.

The first TCO layer 105 and the second TCO layer 125 may each comprise tin oxide, zinc oxide, indium tin oxide, cadmium stannate, combinations thereof, or other suitable materials. It is understood that the TCO materials may also include additional dopants and components. For example, zinc oxide may further include dopants, such as aluminum, gallium, boron, and other suitable dopants. In one embodiment, zinc oxide comprises 5 atomic percent or less of dopants. In another embodiment, zinc oxide comprises 2.5 atomic percent or less aluminum. In certain instances, the substrate 104 may be provided by the glass manufacturers with the first TCO layer 105 already provided.

The top cell 106 may comprise a p-doped layer 110, an intrinsic layer 112, and an n-doped layer 114. The p-doped layer 110 may comprise silicon based materials doped by an element selected from Group III of the Periodic Table of Elements. In one embodiment, the p-doped layer 110 may comprise boron doped silicon. The n-doped layer 114 may comprise silicon based materials doped by an element selected from Group V of the Periodic Table of Elements. In one embodiment, the n-doped layer 114 may comprise phosphorus doped silicon. The doped silicon films 110, 114 may comprise amorphous silicon, polycrystalline silicon, or microcrystalline silicon with a thickness between about 5 nm and about 50 nm. In one embodiment, the p-doped layer 110 may be formed to a thickness between about 60 Å and about 300 Å. In one embodiment, the n-doped layer 114 may be formed to a thickness between about 100 Å and about 400 Å. The entire top cell 106 may be deposited within the same processing chamber. In one embodiment, the p-doped layer 110, the intrinsic layer 112, and the n-doped layer 114 may be deposited in separate chambers. In another embodiment, the p-doped layer 110 may be deposited in a first chamber while the intrinsic layer 112 and the n-doped layer 114 may be deposited in a second chamber. Each of the layers of the top cell 106 may be deposited by a PECVD process.

The intrinsic layer 112 may comprise intrinsic amorphous silicon. The intrinsic layer 112 may be deposited to a thickness of about 1,000 Angstroms to about 4,000 Angstroms. In another embodiment, the intrinsic layer 112 may be formed to a thickness between about 1,500 Angstroms and about 3,500 Angstroms. In one embodiment, the intrinsic layer 112 may be deposited to a thickness of about 3,000 Angstroms. The intrinsic layer 112 may be deposited using a power density (i.e., power per area of the substrate) of about 0.1 W/cm$^2$ at a temperature of about 200 degrees Celsius.

The bottom cell 108 may comprise a p-doped layer 116, an intrinsic layer 118, and an n-doped layer 120. In one embodiment, the p-doped layer 116, the intrinsic layer 118, and the n-doped layer 102 may be deposited in the same chamber. In another embodiment, the p-doped layer 116, the intrinsic layer 118, and the n-doped layer 120 may be deposited in separate chambers. In still another embodiment, the p-doped layer 116 may be deposited in a first chamber while the intrinsic layer 118 and the n-doped layer 120 may be deposited in a second chamber. The p-doped layer 116 and n-doped layer 120 may be equivalent to those described above in relation to the top cell 106. In certain embodiments, the p-doped layer 116 may be formed to a thickness between about 100 Angstroms and about 400 Angstroms. In certain embodiments, the n-doped layer 120 may be formed to a thickness between about 100 Angstroms and about 500 Angstroms.

The intrinsic layer 118, on the other hand, may comprise intrinsic microcrystalline silicon. Microcrystalline silicon has a much lower absorption coefficient than amorphous silicon. Therefore, the intrinsic microcrystalline silicon layer 118 needs to be significantly thicker than the intrinsic amorphous silicon layer 112. In one embodiment, the intrinsic microcrystalline silicon layer 118 may be between about 10,000 Angstroms and about 30,000 Angstroms thick. In another embodiment, the intrinsic microcrystalline silicon layer 118 may be between about 1 micrometer to about 2 micrometers thick. Because the intrinsic microcrystalline silicon layer 118 is significantly thicker than the intrinsic amorphous silicon layer 112, the intrinsic microcrystalline silicon layer 118 may take a significantly longer time to deposit compared to intrinsic amorphous silicon layer 112.

The metal back layer 130 may include, but is not limited to a material selected from the group consisting of Al, Ag, Ti, Cr, Au, Cu, Pt, alloys thereof, or combinations thereof. Other processes may be performed to form the solar cell 100, such a laser scribing processes. Other films, materials, substrates, and/or packaging may be provided over metal back layer 130 to complete the solar cell 100. The solar cells 100 may be interconnected to form modules, which in turn can be connected to form arrays.

Figure 2:
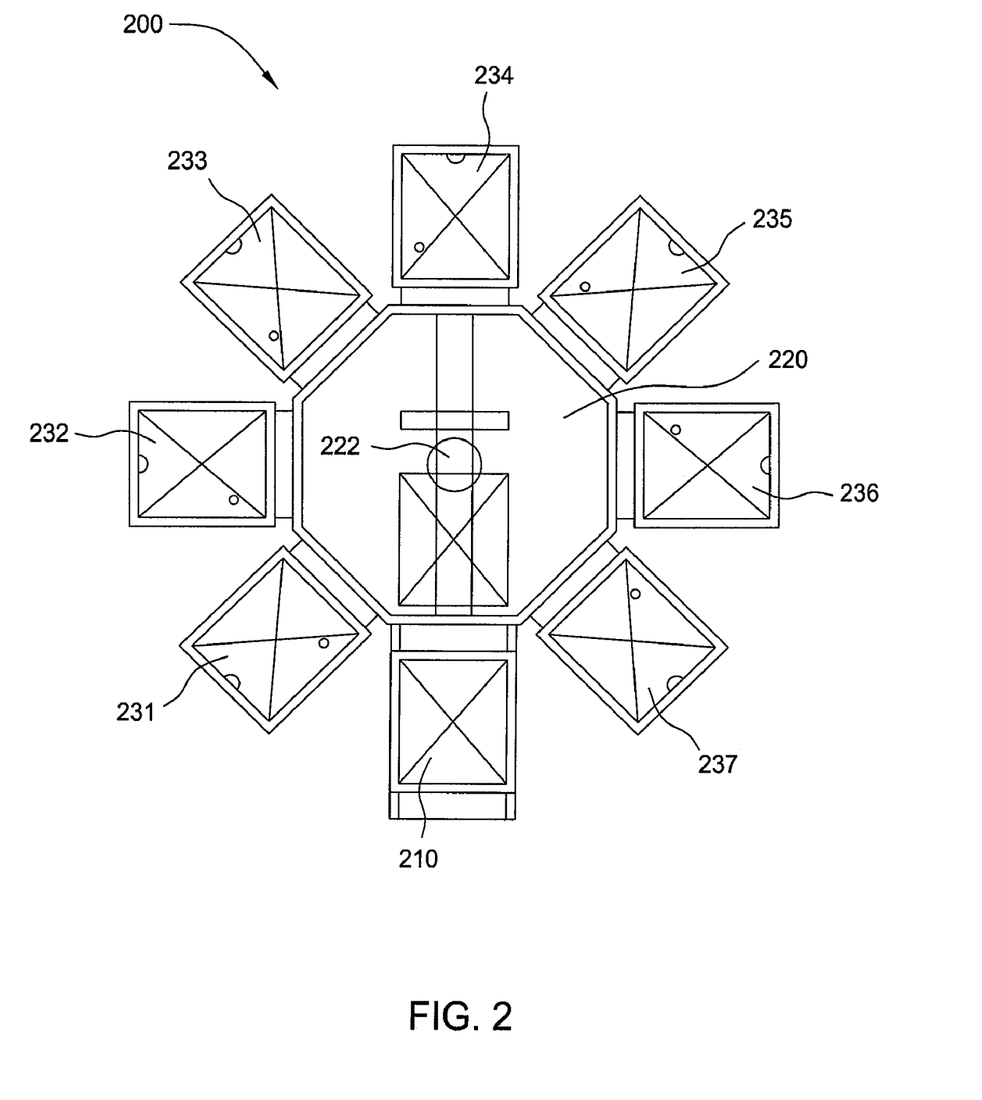
FIG. 2 is a top schematic view of one embodiment of a process system having a plurality of process chambers.
Figure 3:
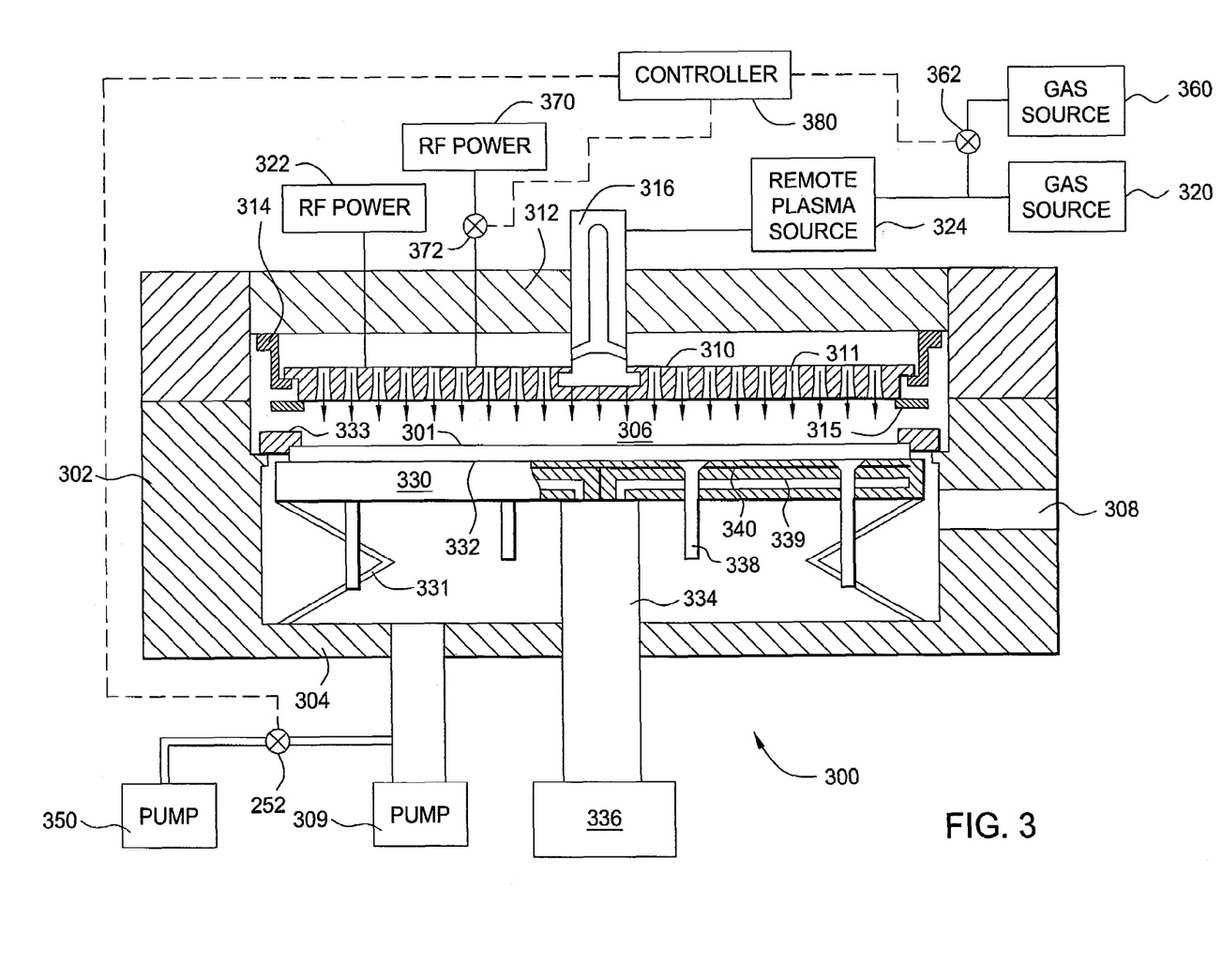
FIG. 3 is a schematic cross-section view of one embodiment of a plasma enhanced chemical vapor deposition (PECVD) chamber in which one or more films of a solar cell may be deposited.

FIG. 2 is a top schematic view of one embodiment of a process system 200 having a plurality of process chambers 231-237, such as PECVD chamber 300 of FIG. 3 or other suitable chambers capable of depositing silicon films. The process system 200 includes a transfer chamber 220 coupled to a load lock chamber 210 and the process chambers 231-237. The load lock chamber 210 allows substrates to be transferred between the ambient environment outside the system and vacuum environment within the transfer chamber 220 and process chambers 231-237. The load lock chamber 210 includes one or more evacuatable regions holding one or more substrate. The evacuatable regions are pumped down during input of substrates into the system 200 and are vented during output of the substrates from the system 200. The transfer chamber 220 has at least one vacuum robot 222 disposed therein that is adapted to transfer substrates between the load lock chamber 210 and the process chambers 231-237. Seven process chambers 213-237 are shown in FIG. 2; however, the system 200 may have any suitable number of process chambers 231-237.

FIG. 3 is a schematic cross-section view of one embodiment of a PECVD chamber 300 in which one or more films of a solar cell, such as the solar cell 100 of FIG. 1, may be deposited. One suitable PECVD chamber is available from Applied Materials, Inc., located in Santa Clara, Calif. It is contemplated that other deposition chambers, including those from other manufacturers, may be utilized to practice the present invention.

The chamber 300 generally includes walls 302, a bottom 304, a showerhead 310, and substrate support 330 which define a process volume 306. The process volume is accessed through a valve 308 such that the substrate 301 may be transferred in and out of the chamber 300. The substrate support 330 includes a substrate receiving surface 332 for supporting a substrate 301 and stem 334 coupled to a lift system 336 to raise and lower the substrate support 330. A shadow frame 333 may be optionally placed over the periphery of the substrate 301. Lift pins 338 are moveably disposed through the substrate support 330 to move a substrate 301 to and from the substrate receiving surface 332. The substrate support 330 may also include heating elements 340 and/or cooling elements 339 to maintain the substrate support 330 at a desired temperature. The substrate support 330 may also include grounding straps 331 to provide RF grounding at the periphery of the substrate support 330.

The showerhead 310 is coupled to a backing plate 312 at its periphery by a suspension 314. The showerhead 310 may also be coupled to the backing plate by one or more center supports 316 to help prevent sag and/or control the straightness/curvature of the showerhead 310. A gas source 320 is coupled to the backing plate 312 to provide gas through the backing plate 312 and through the showerhead 310 to the substrate receiving surface 332. A vacuum pump 309 is coupled to the chamber 300 to control the process volume 306 at a desired pressure. An RF power source 322 is coupled to the backing plate 312 and/or to the showerhead 310 to provide a RF power to the showerhead 310 so that an electric field is created between the showerhead 310 and the substrate support 330 so that a plasma may be generated from the gases between the showerhead 310 and the substrate support 330. Various RF frequencies may be used, such as a frequency between about 0.3 MHz and about 200 MHz. In one embodiment the RF power source is provided at a frequency of 13.56 MHz.

A remote plasma source 324, such as an inductively coupled remote plasma source, may also be coupled between the gas source 320 and the backing plate 312. Between processing substrates, a cleaning gas may be provided to the remote plasma source 324 so that a remote plasma is generated and provided to clean chamber components. The cleaning gas may be further excited by the RF power source 322 provided to the showerhead. Suitable cleaning gases include but are not limited to $NF_3$, $F_2$, and $SF_6$.

When depositing microcrystalline silicon compared to amorphous silicon, more power and more process gas may be necessary. Similarly, the process chamber pressure for depositing amorphous silicon may be lower compared to microcrystalline silicon. Depositing p-doped amorphous silicon may comprise providing a gas mixture of hydrogen gas to silane gas in a ratio of about 20:1 or less. Silane gas may be provided at a flow rate between about 1 sccm and about 10 sccm. Hydrogen gas may be provided at a flow rate between about 5 sccm/L and about 60 sccm. Trimethylboron may be provided at a flow rate between about 0.005 sccm and about 0.05 sccm. In other words, if trimethylboron is provided in a 0.5% molar or volume concentration in a carrier gas, then the dopant/carrier gas mixture may be provided at a flow rate between about 1 sccm and about 10 sccm. Methane may be provided at a flow rate between about 1 sccm and about 15 sccm. An RF power between about 15 milliWatts/cm$^2$ and about 200 milliWatts/cm$^2$ may be provided to the showerhead. The pressure of the chamber is maintained between about 0.1 Torr and 20 Torr, preferably between about 1 Torr and about 4 Torr. The deposition rate of the p-type amorphous silicon layer may be about 100 Å/min or more.

Depositing microcrystalline silicon may comprise providing a gas mixture of silane gas to hydrogen gas in a ratio between about 1:20 and about 1:200. Silane gas may be provided at a flow rate between about 0.5 sccm and about 5 sccm. Hydrogen gas may be provided at a flow rate between about 40 sccm and about 400 sccm. In certain embodiments, the silane flow rate may be ramped up from a first flow rate to a second flow rate during deposition. In certain embodiments, the hydrogen flow rate may be ramped down from a first flow rate to a second flow rate during deposition. An RF power of about 300 milliWatts/cm$^2$ or greater, preferably 600 milli- Watts/cm² or greater, may be provided to the showerhead. In certain embodiments, the power density may be ramped down from a first power density to a second power density during deposition. The pressure of the chamber is maintained between about 1 Torr and about 100 Torr, preferably between about 3 Torr and about 20 Torr, more preferably between about 4 Torr and about 12 Torr. The deposition rate of the intrinsic type microcrystalline silicon layer may be about 200 Å/min or more, preferably about 500 Å/min.

To deposit microcrystalline silicon in the chamber 300 that deposited amorphous silicon, a supplemental RF power supply 370 may be coupled with the chamber 300. A switch 372 may be coupled between the supplemental RF power source 370 and the showerhead 310. During amorphous silicon deposition, the switch 372 may be disconnected so that the RF current does not flow to the showerhead 310. A controller 380 may control the switch 372. Alternatively, the supplemental RF power supply 370 may be turned on or off based upon the need for the additional RF current. For amorphous silicon deposition, the supplemental RF power supply 370 may be turned off. For microcrystalline silicon deposition, the supplemental power supply 370 may be turned on.

Similarly, the supplemental vacuum pump 350 may be turned on to evacuate the chamber 300 to a lower pressure when necessary. For amorphous silicon deposition, the supplemental vacuum pump 350 may be turned off. Alternatively, the valve 352 coupled between the chamber 300 and the supplemental vacuum pump 350 may be closed to prevent the supplemental vacuum pump 350 from drawing a vacuum from the process chamber 300. The valve 352 and/or the supplemental vacuum pump 350 may be coupled to the controller 380 that controls the operation of the valve 352 and/or the vacuum pump 350. The supplemental vacuum pump 350 may be coupled with the chamber 300 through the same coupling as the vacuum pump 336. In one embodiment, the supplemental vacuum pump 350 may have a different coupling from the vacuum pump 336.

When depositing microcrystalline silicon, additional processing gas may be necessary. Therefore, a supplemental gas source 360 may be coupled with the chamber 300. The supplemental gas source 360 may be coupled into the same gas input line to the remote plasma source 324 as the gas source 320. A valve 362 may be opened or closed to permit or prevent the passage of additional gas into the process line to the remote plasma source 324. The valve 362 and the supplemental gas source 360 may be controlled by the controller 380. During amorphous silicon deposition, less processing gas may be necessary. Therefore, the valve 362 may be closed during amorphous silicon deposition.

Thus, the supplemental RF power supply 370, the supplemental vacuum pump 350, and the supplemental gas source 360 may be coupled with the chamber 300 when necessary to supply the various vacuum, amount of gas, and RF power to the chamber 300 when necessary and decoupled or switched off whenever the supplemental vacuum, supplemental RF power, or supplemental processing gas is not needed.

To produce a dual tandem solar cell, the top cell may be formed over the substrate and then the bottom cell may be formed over the top cell. The bottom cell may comprise a p-doped amorphous silicon layer, an amorphous intrinsic silicon layer, and an n-doped microcrystalline silicon layer. The top cell may comprise a p-doped microcrystalline silicon layer, an intrinsic microcrystalline silicon layer, and an n-doped amorphous silicon layer.

For the top cell, the p-doped amorphous silicon layer may be deposited in a first processing chamber utilize silane gas and hydrogen gas along with a dopant gas. The flow rate for the silane gas may be between about 8,000 sccm and about 9,000 sccm. The flow rate for the hydrogen gas may be between about 40,000 sccm and about 50,000 sccm. The flow ratio of the hydrogen gas to the silane gas may be between about 5.0:1 to about 6.0:1. The showerhead may be biased with an RF current between about 0.05 W/cm² to about 0.1 W/cm² (watts per area of the substrate), the temperature of the deposition may be between about 180 degrees Celsius and about 220 degrees Celsius, and the pressure may be between about 2.0 Torr and about 3.0 Torr.

The intrinsic amorphous silicon layer and the n-doped microcrystalline silicon layer may be deposited in a second processing chamber. The intrinsic amorphous silicon layer may be deposited with a flow rate for silane gas between about 8,500 sccm and about 9,500 sccm, a flow rate for hydrogen gas between about 110,000 sccm and about 120,000 sccm, and a flow ratio of the hydrogen gas to the silane gas between about 10.0:1 to about 13.0:1. The showerhead may be biased with an RF current between about 0.05 W/cm² to about 0.10 W/cm² (watts per area of the substrate), the temperature of the deposition may be between about 180 degrees Celsius and about 220 degrees Celsius, and the pressure may be between about 1.5 Torr and about 3.0 Torr.

The n-doped microcrystalline silicon layer may be deposited within the second processing chamber utilizing silane gas, hydrogen gas, and a dopant. The deposition may occur with a flow rate for silane gas between about 1,000 sccm and about 1,100 sccm, a flow rate for hydrogen gas between about 320,000 sccm and about 330,000 sccm, and a flow ratio of the hydrogen gas to the silane gas may be between about 300:1 to about 310:1. The showerhead may be biased with an RF current between about 0.30 W/cm² to about 0.50 W/cm² (watts per area of the substrate), the temperature of the deposition may be between about 180 degrees Celsius and about 220 degrees Celsius, and the pressure may be between about 8.0 Torr and about 10.0 Torr.

For the bottom cell, the p-doped microcrystalline silicon layer may be deposited in a third processing chamber utilizing silane gas and hydrogen gas along with a dopant gas. The flow rate for the silane gas may be between about 500 sccm and about 550 sccm. The flow rate for the hydrogen gas may be between about 330,000 sccm and about 350,000 sccm. The flow ratio of the hydrogen gas to the silane gas may be between about 645:1 to about 655:1. The showerhead may be biased with an RF current between about 0.10 W/cm² to about 0.20 W/cm² (watts per area of the substrate), the temperature of the deposition may be between about 180 degrees Celsius and about 220 degrees Celsius, and the pressure may be between about 8.0 Torr and about 10.0 Torr.

The intrinsic microcrystalline silicon layer and the n-doped amorphous silicon layer may be deposited in a fourth processing chamber. The intrinsic microcrystalline silicon layer may be deposited with a flow rate for silane gas between about 7,500 sccm and about 8,500 sccm, a flow rate for hydrogen gas between about 650,000 sccm and about 825,000 sccm, and a flow ratio of the hydrogen gas to the silane gas between about 80:1 to about 100:1. The showerhead may be biased with an RF current between about 0.90 W/cm² to about 1.05 W/cm² (watts per area of the substrate), the temperature of the deposition may be between about 180 degrees Celsius and about 220 degrees Celsius, and the pressure may be between about 8.0 Torr and about 10.0 Torr.

The n-doped amorphous silicon layer may be deposited utilizing silane gas, hydrogen gas, and a dopant. The deposition may occur with a flow rate for silane gas between about 2,500 sccm and about 5,000 sccm, a flow rate for hydrogen gas between about 7,500 sccm and about 22,000 sccm, and a flow ratio of the hydrogen gas to the silane gas may be between about 4.5:1 to about 9.0:1. The showerhead may be biased with an RF current between about 0.05 W/cm$^2$ to about 0.10 W/cm$^2$ (watts per area of the substrate), the temperature of the deposition may be between about 180 degrees Celsius and about 220 degrees Celsius, and the pressure may be between about 1.0 Torr and about 2.0 Torr.

Figure 4:
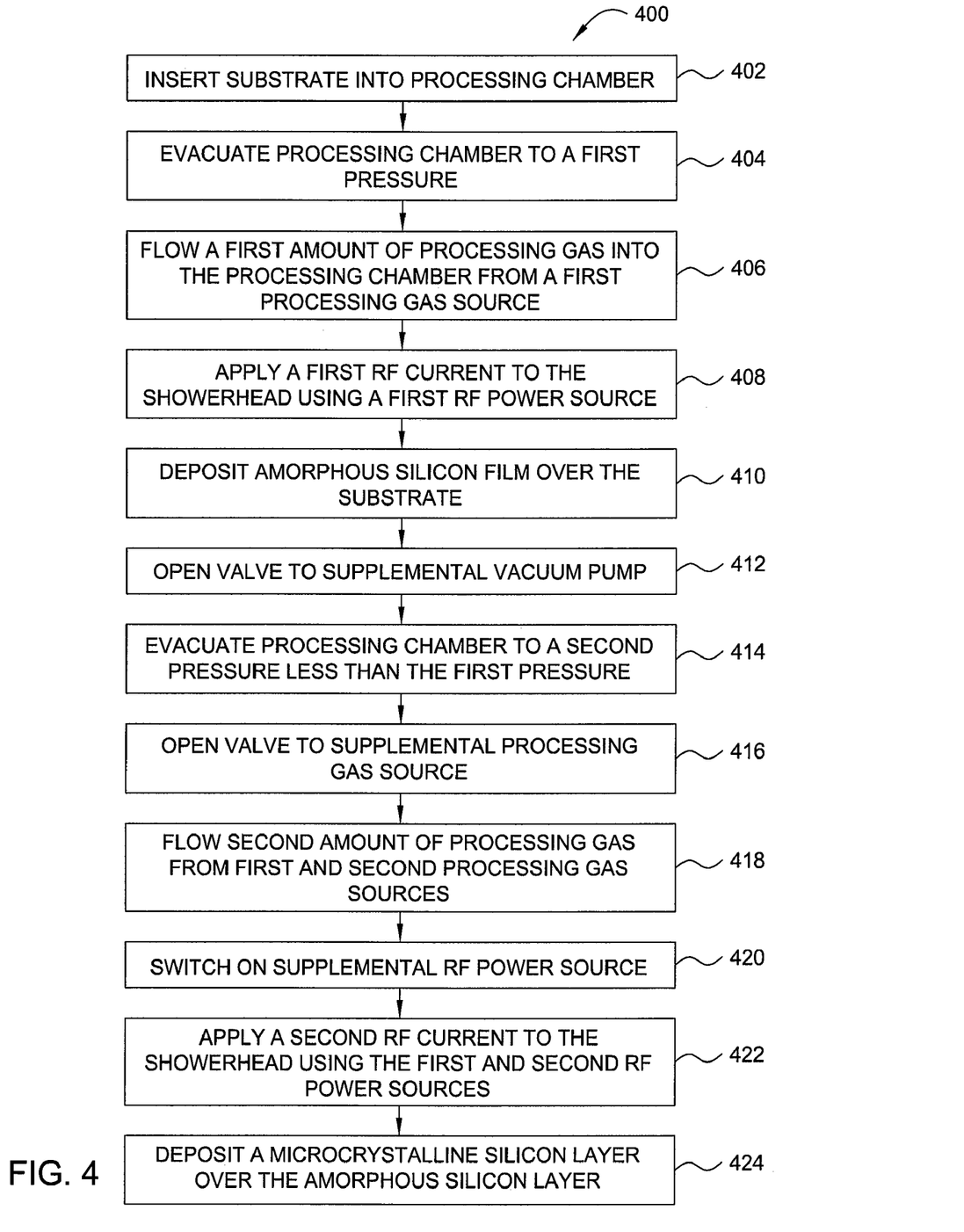
FIG. 4 is a flow chart of a solar cell manufacturing process utilizing supplemental RF power, a supplemental gas source, and supplemental pumping.

FIG. 4 is a flow chart 400 of a solar cell manufacturing process utilizing supplemental RF power, a supplemental gas source, and supplemental pumping. Initially, the substrate may be inserted into the processing chamber (Step 402) and the processing chamber may be evacuated by a first vacuum pump (Step 404). The evacuation may occur before the substrate is inserted into the processing chamber. A first amount of processing gas may be introduced to the processing chamber from a first processing gas source (Step 406), the showerhead may be biased by a first RF current from a first RF power source (Step 408). An amorphous silicon layer may be deposited (Step 410). A valve may be opened to a supplemental vacuum pump (Step 412) and the processing chamber may be evacuated to a second pressure lower than the first pressure (Step 414). A valve to a supplemental gas source may be opened (Step 416) to permit supplemental processing gas to be introduced to the processing chamber along with processing gas from the first processing gas source (Step 418). A supplemental RF power source may be switched on or coupled to the showerhead (Step 420) to provide supplemental RF power to the showerhead in addition to the RF power supplied form the first RF power source (Step 422). A microcrystalline silicon layer may be deposited over the amorphous silicon layer (Step 424).

Figure 5:
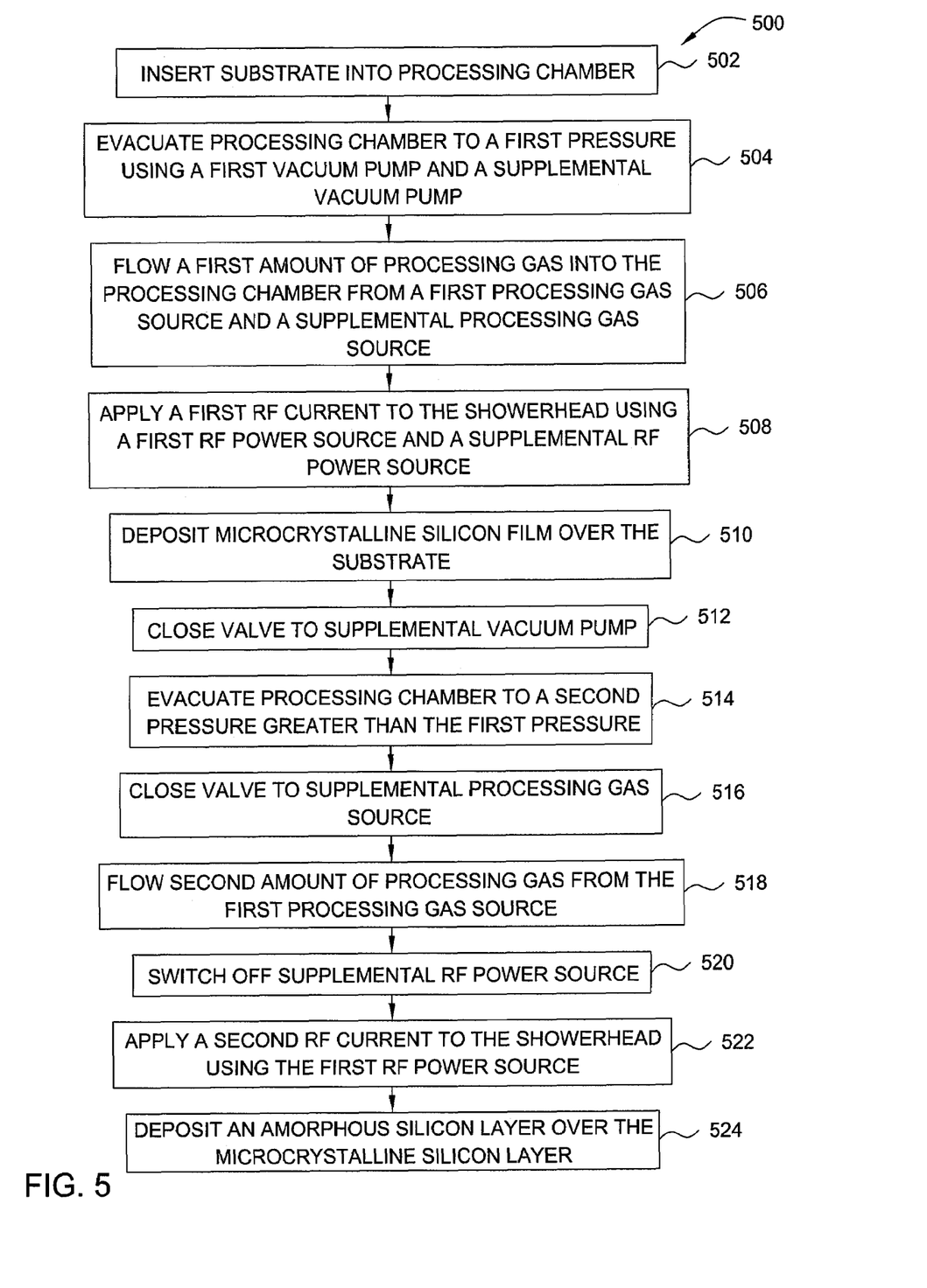
FIG. 5 is a flow chart of a solar cell manufacturing process utilizing supplemental RF power, a supplemental gas source, and supplemental pumping.

FIG. 5 is a flow chart 500 of a solar cell manufacturing process utilizing supplemental RF power, a supplemental gas source, and supplemental pumping. Initially, the substrate may be inserted into the processing chamber (Step 502) and the processing chamber may be evacuated by a first vacuum pump and a supplemental vacuum pump (Step 504). The evacuation may occur before the substrate is inserted into the processing chamber. A first amount of processing gas may be introduced to the processing chamber from a first processing gas source and a supplemental processing gas source (Step 506), the showerhead may be biased by a first RF current from a first RF power source and a supplemental RF power source (Step 508). A microcrystalline silicon layer may be deposited (Step 510). A valve may be closed to the supplemental vacuum pump (Step 512) and the processing chamber may be evacuated to a second pressure greater than the first pressure (Step 514). A valve to a supplemental gas source may be closed (Step 516) to prevent supplemental processing gas from being introduced to the processing chamber along with processing gas from the first processing gas source (Step 518). A supplemental RF power source may be switched off or decoupled from the showerhead (Step 520) to prevent supplemental RF power from being introduced to the showerhead in addition to the RF power supplied form the first RF power source (Step 522). An amorphous silicon layer may be deposited over the microcrystalline silicon layer (Step 524).

Figure 6:
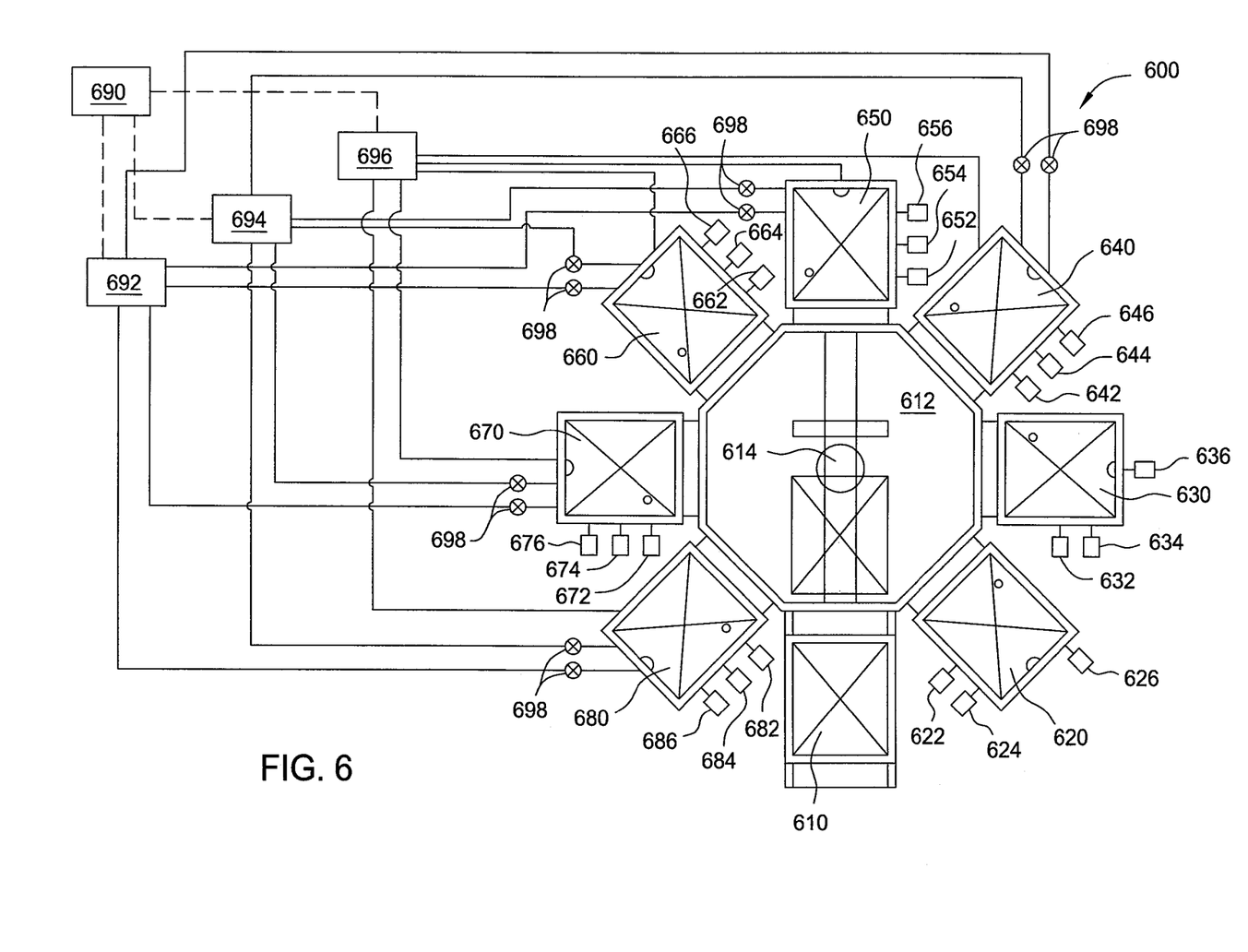
FIG. 6 is a top schematic view of one embodiment of a process system having a plurality of process chambers sharing a common supplemental RF power source, a supplemental gas source, and a supplemental pump.

FIG. 6 is a top schematic view of one embodiment of a process system 600 having a plurality of process chambers sharing a common supplemental RF power source, a supplemental gas source, and a supplemental pump. The process system 600 includes a transfer chamber 612 coupled to a load lock chamber 610 and the process chambers 620, 630, 640, 650, 660, 670, 680. The load lock chamber 610 allows substrates to be transferred between the ambient environment outside the system and vacuum environment within the transfer chamber 612 and process chambers 620, 630, 640, 650, 660, 670, 680. The load lock chamber 610 includes one or more evacuatable regions holding one or more substrates. The evacuatable regions are pumped down during input of substrates into the system 600 and are vented during output of the substrates from the system 600. The transfer chamber 612 has at least one vacuum robot 614 disposed therein that is adapted to transfer substrates between the load lock chamber 610 and the process chambers 620, 630, 640, 650, 660, 670, 680. Seven process chambers are shown in FIG. 6; however, the system 600 may have any suitable number of process chambers 620, 630, 640, 650, 660, 670, 680.

Each processing chamber 620, 630, 640, 650, 660, 670, 680 may have its own RF power source 622, 632, 642, 652, 662, 672, 682, gas source, 624, 634, 644, 654, 664, 674, 684, and vacuum pump 626, 636, 646, 656, 666, 676, 686 coupled thereto. In a seven processing chamber 620, 630, 640, 650, 660, 670, 680 system 600 that deposits both amorphous silicon and microcrystalline silicon, two processing chambers 620, 630 may be dedicated solely to microcrystalline silicon deposition while five processing chambers 640, 650, 660, 670, 680 may be dedicated to both amorphous silicon deposition and microcrystalline silicon deposition.

The RF power source 622, 632 for processing chambers 620, 630 may be sufficient to introduce RF current to the showerhead for microcrystalline silicon deposition. The RF power source 642, 652, 662, 672, 682 for processing chambers 640, 650, 660, 670, 680 may be sufficient to introduce only enough RF current to the showerhead for depositing amorphous silicon. The gas source 624, 634 for processing chambers 620, 630 may be sufficient to introduce enough processing gases to deposit microcrystalline silicon. The gas source 644, 654, 664, 674, 684 for processing chambers 640, 650, 660, 670, 680 may be sufficient to introduce only enough processing gas to deposit amorphous silicon. The vacuum pump 626, 636 may be sufficient to draw a vacuum in the processing chamber 620, 630 to deposit microcrystalline silicon. The vacuum pump 646, 656, 666, 676, 686 may be sufficient to draw vacuum to deposit amorphous silicon.

For the five processing chambers 640, 650, 660, 670, 680 dedicated to both amorphous silicon deposition and microcrystalline silicon deposition, supplemental pumping, supplemental gas supply, and supplemental RF power may be necessary. A supplemental gas source 692 may be coupled to each of chambers 640, 650, 660, 670, 680 to supply the additional processing gas that may be necessary to deposit microcrystalline silicon. A valve 698 may be coupled along the line between the gas source 692 and the processing chambers 640, 650, 660, 670, 680. A supplemental vacuum pump 694 may be coupled to each of chambers 640, 650, 660, 670, 680 to draw a sufficient vacuum to deposit microcrystalline silicon. A valve 698 may be coupled along the line between the supplemental vacuum pump 694 and the processing chambers 640, 650, 660, 670, 680. A supplemental RF power source 696 may be coupled to each of processing chambers 640, 650, 660, 670, 680 to supply sufficient RF current to the showerhead to deposit microcrystalline silicon. A controller 690 may be coupled to the supplemental gas source 692, the supplemental vacuum pump 694, the valves 698, and the supplemental RF power source 696 to control when the supplemental sources are working to supplement the processing chambers 640, 650, 660, 670, 680.

By utilizing a common, supplemental RF power supply, gas source, and vacuum pump, multiple chambers can share supplemental sources only when necessary. The supplemental sources can be diverted to other chambers when not needed. The sources dedicated to each processing chamber may be smaller and hence, cheaper, because the sources dedicated to each processing chamber may be chosen to minimize unneeded resources and thus, optimize efficiency. The shared resources permit multiple chambers to share additional RF, gas, and vacuum capability that may be needed only on a temporary basis.

While the foregoing is directed to embodiments of the present invention, other and further embodiments of the invention may be devised without departing from the basic scope thereof, and the scope thereof is determined by the claims that follow.

The invention claimed is:

1. A solar cell fabrication process, comprising:
depositing a first silicon containing layer on a substrate in a processing chamber while operating with a first vacuum pump, a first gas source, and a first RF power source; and
depositing a second silicon containing layer over the first silicon containing layer in the processing chamber while operating with the first vacuum pump, the first gas source, the first RF power source, a second vacuum pump, a second gas source, and a second RF power source.

2. The process of claim 1, wherein the first silicon containing layer comprises amorphous silicon and the second silicon containing layer comprises microcrystalline silicon.

3. The process of claim 1, further comprising opening a valve to permit the second vacuum pump to work in tandem with the first vacuum pump.

4. The process of claim 1, wherein the second gas source and the first gas source are substantially identical.

5. The process of claim 1, wherein an amount of RF current applied when the depositing the second silicon containing layer is greater than an amount of RF current applied when depositing the first silicon containing layer.

6. The process of claim 1, wherein an amount processing gas introduced when the depositing the second silicon containing layer is greater than an amount of processing gas introduced when depositing the first silicon containing layer.

7. The process of claim 1, wherein an evacuation pressure for the depositing the second silicon containing layer is less than an evacuation pressure for depositing the first silicon containing layer.

8. A solar cell fabrication process, comprising:
evacuating a processing chamber to a first pressure with a first vacuum pump;
depositing an amorphous silicon layer over a substrate in the processing chamber while applying a first RF current from a first RF power source to a showerhead disposed in the processing chamber, and while introducing a first amount of processing gas into the processing chamber from a first gas source;
evacuating the processing chamber to a second pressure that is less than the first pressure using the first vacuum pump and a second vacuum pump; and
depositing a microcrystalline silicon layer over the amorphous silicon layer while applying a second RF current greater than the first RF current, the second RF current flowing from the first and second RF power sources, and while introducing a second amount of processing gas greater than the first amount of processing gas, the second amount flowing from the first gas source and a second gas sources source.

9. The process of claim 8, further comprising opening a valve to permit the second vacuum pump to work in tandem with the first vacuum pump.

10. The process of claim 8, wherein the second gas source and the first gas source are substantially identical.

11. A solar cell fabrication process, comprising:
disposing a first substrate in a first processing chamber having a first RF power source, a first vacuum pump, a first gas source, a supplemental RF power source, a supplemental vacuum pump, and a supplemental gas source coupled thereto;
depositing an amorphous silicon layer over the first substrate while operating with the first RF power source, the first vacuum pump, and the first gas source;
disposing a second substrate in a second processing chamber having a second RF power source, a second vacuum pump, a second gas source, the supplemental RF power source, the supplemental vacuum pump, and the supplemental gas source coupled thereto;
depositing a microcrystalline silicon layer over the second substrate while operating with the second RF power source, the second vacuum pump, the second gas source, the supplemental RF power source, the supplemental vacuum pump, and the supplemental gas source; and
depositing a microcrystalline silicon layer over the amorphous silicon layer in the first processing chamber while operating with the first RF power source, the first vacuum pump, the first gas source, the supplemental RF power source, the supplemental vacuum pump, and the supplemental gas source.

12. The process of claim 11, further comprising depositing an amorphous silicon layer over the second substrate in the second processing chamber.

13. The process of claim 12, wherein the amorphous silicon layer is deposited over the second substrate before depositing the microcrystalline silicon layer.

14. The process of claim 12, wherein the amorphous silicon layer is deposited over the second substrate prior to depositing the microcrystalline silicon layer.

* * * * *